(12) United States Patent
Guo et al.

(10) Patent No.: US 11,227,852 B2
(45) Date of Patent: Jan. 18, 2022

(54) INTEGRATED CIRCUIT PACKAGING

(71) Applicant: TEXAS INSTRUMENTS INCORPORATED, Dallas, TX (US)

(72) Inventors: Honglin Guo, Dallas, TX (US); Jason Chien, Taipei (TW); Byron Lovell Williams, Plano, TX (US); Jeffrey Alan West, Dallas, TX (US); Anderson Li, New Taipei (TW); Arvin Nono Verdeflor, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/854,823

(22) Filed: Apr. 21, 2020

(65) Prior Publication Data
US 2020/0251440 A1 Aug. 6, 2020

Related U.S. Application Data

(63) Continuation of application No. 16/025,603, filed on Jul. 2, 2018, now Pat. No. 10,629,562.
(Continued)

(51) Int. Cl.
*H01L 23/00* (2006.01)
*H01L 21/56* (2006.01)
(Continued)

(52) U.S. Cl.
CPC .............. *H01L 24/49* (2013.01); *H01L 21/56* (2013.01); *H01L 21/565* (2013.01); *H01L 23/3121* (2013.01); *H01L 23/3142* (2013.01); *H01L 23/4952* (2013.01); *H01L 23/49575* (2013.01); *H01L 24/85* (2013.01); *H01L 25/0655* (2013.01); *H01L 25/50* (2013.01); H01L 23/3107 (2013.01); H01L 23/49503 (2013.01); H01L 24/45 (2013.01); H01L 24/48 (2013.01); H01L 2224/45144 (2013.01); H01L 2224/45147 (2013.01); H01L 2224/45565 (2013.01); H01L 2224/45664 (2013.01); H01L 2224/48137 (2013.01); H01L 2224/48247 (2013.01); H01L 2224/49171 (2013.01); H01L 2224/49175 (2013.01); H01L 2224/49505 (2013.01); H01L 2224/85013 (2013.01);
(Continued)

(58) Field of Classification Search
CPC ....... H01L 24/49; H01L 21/56; H01L 21/565; H01L 23/3121; H01L 23/4952; H01L 23/49575; H01L 24/85; H01L 25/50
USPC ......... 257/676, 677, 678, 666; 438/123, 124
See application file for complete search history.

(56) References Cited

U.S. PATENT DOCUMENTS

2005/0145996 A1 7/2005 Luo et al.
2011/0248750 A1 10/2011 Seo et al.
(Continued)

*Primary Examiner* — Thinh T Nguyen
(74) *Attorney, Agent, or Firm* — Dawn Jos; Charles A. Brill; Frank D. Cimino

(57) ABSTRACT

An integrated circuit and methods for packaging the integrated circuit. In one example, a method for packaging an integrated circuit includes connecting input/output pads of a first integrated circuit die to terminals of a lead frame via palladium coated copper wires. An oxygen plasma is applied to the first integrated circuit die and the palladium coated copper wires. The first integrated circuit die and the palladium coated copper wires are encapsulated in a mold compound after application of the oxygen plasma.

13 Claims, 5 Drawing Sheets

Related U.S. Application Data

(60) Provisional application No. 62/611,818, filed on Dec. 29, 2017.

(51) Int. Cl.
  *H01L 25/00* (2006.01)
  *H01L 23/495* (2006.01)
  *H01L 23/31* (2006.01)
  *H01L 25/065* (2006.01)

(52) U.S. Cl.
  CPC ............... *H01L 2224/85913* (2013.01); *H01L 2224/85986* (2013.01); *H01L 2924/00014* (2013.01); *H01L 2924/1205* (2013.01); *H01L 2924/181* (2013.01)

(56) References Cited

U.S. PATENT DOCUMENTS

| | | |
|---|---|---|
| 2012/0168927 A1 | 7/2012 | Itoh |
| 2012/0208324 A1 | 8/2012 | Harata et al. |
| 2013/0200506 A1 | 8/2013 | Park |
| 2016/0111389 A1* | 4/2016 | Yamada et al. ......... H01L 24/45 174/126 |
| 2017/0338169 A1 | 11/2017 | Mahler et al. |
| 2018/0019194 A1 | 1/2018 | Papillon |

\* cited by examiner though the oxidized copper is initially covered by the
INTEGRATED CIRCUIT PACKAGING This application is a continuation of U.S. patent application Ser. No. 16/025,603, filed Jul. 2, 2018, which claims the benefit of Provisional Patent Application No. 62/611,818, filed Dec. 29, 2017, the contents of all of which are herein incorporated by reference in its entirety.

BACKGROUND

Isolation is used in electrical circuits to prevent the flow of direct currents and undesirable alternating currents between two parts of a system. While preventing flow of undesirable currents between parts of a system, isolation may allow signal transfer between the isolated parts of the system. Isolation may be provided by integrated circuits referred to as isolators. Isolators may be included in electronic systems for safety reasons and/or to protect electronic components of the systems. For example, where two systems need to communicate, but the systems have grounds that may be at different potentials, communication may be through an isolator that is tied to the grounds of both systems but allows no current flow between the grounds. Various types of isolators may include optical coupling, capacitive coupling, inductive coupling, or other types of coupling to isolate systems while allowing communication between the systems.

Like other integrated circuits, isolators are provided in packages that typically include at least one die and at least one substrate or lead frame to which the die is affixed by an attachment medium such as solder or epoxy. The substrate facilitates electrical attachment of the die to other circuits. The various components of the integrated circuit package are generally encased in a protective mold compound, such as epoxy.

SUMMARY

An integrated circuit and methods for packaging the integrated circuit are disclosed herein. In one example, a method for packaging an integrated circuit includes connecting input/output pads of a first integrated circuit die to terminals of a lead frame via palladium coated copper wires. An oxygen plasma is applied to the first integrated circuit die and the palladium coated copper wires. The first integrated circuit die and the palladium coated copper wires are encapsulated in a mold compound after application of the oxygen plasma.

In another example, an integrated circuit includes a first circuit die, a second circuit die, a lead frame, palladium coated copper bond wires, gold bond wires, and encapsulation material. The palladium coated copper bond wires conductively couple the first circuit die and the second circuit die to the lead frame. The gold bond wires conductively couple the first circuit die to the second circuit die. The encapsulation material encases the first circuit die, the second circuit die, the lead frame, the palladium coated copper bond wires, and the gold bond wires.

In a further example, a method for packaging an integrated circuit includes connecting input/output pads of a first integrated circuit die to terminals of a lead frame via palladium coated copper wires. The first integrated circuit die is connected to a second integrated circuit die via gold wires. The lead frame, the first integrated circuit die, the second integrated circuit die, the gold wires, and the palladium coated copper wires are encapsulated in a mold compound.

BRIEF DESCRIPTION OF THE DRAWINGS

For a detailed description of various examples, reference will now be made to the accompanying drawings in which.

DETAILED DESCRIPTION

Figure 1:
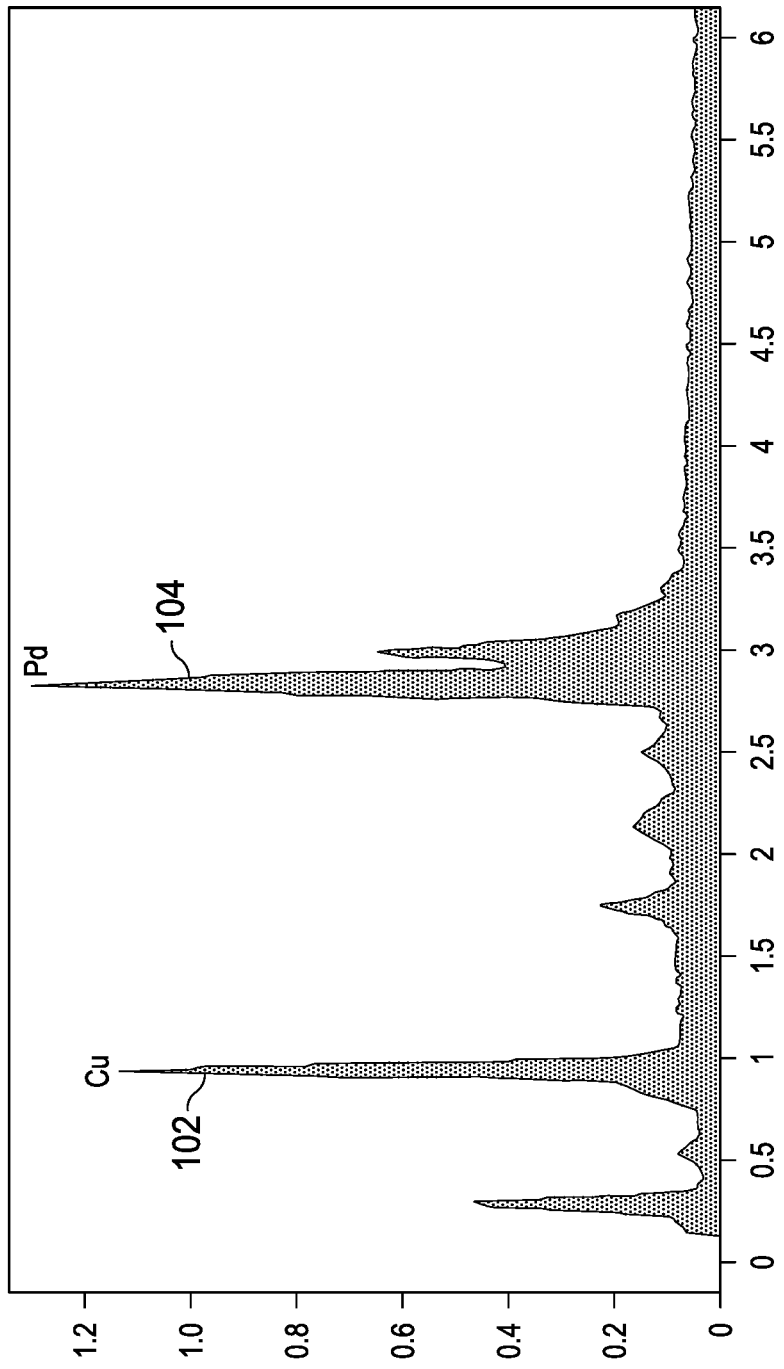
FIG. 1 shows a spectrum of a palladium coated copper bond wire prior to application of a plasma in accordance with various examples.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. The term "approximately" is intended to mean within 10% of a state amounted. Thus, approximately 100 specifies a range of 90-110.

Cost reduction in integrated circuits, such as isolator integrated circuits, is generally desirable. As the cost of gold bonding wire has risen over time, bonding wire made of copper or other metals has because available as a lower cost alternative to gold. Copper has a number of advantages over gold, but use of copper bond wire presents a number of challenges. For example, copper oxidizes at relatively low temperatures. Copper bond wire may coated with palladium to inhibit oxidation. Retention of the palladium coating throughout the packaging process is important to maintain the integrity of the bond wire.

At various points in the integrated circuit packaging process, the assembled components may be cleaned to prepare the assembly for further processing. For example, the integrated circuit assembly may be cleaned to facilitate adhesion in an upcoming packaging operation. In some integrated circuit packaging processes, a circuit assembly may be cleaned by application of a plasma. Plasma is an ionized gas that can effectively remove contaminants from the surfaces of a circuit assembly. For example, plasma may be applied to a circuit die to prepare the die for wire bonding.

In packaging of integrated circuits (e.g., isolator integrated circuits), an argon plasma may be applied to the circuit assembly after the die is wire bonded to the package lead frame. The argon plasma cleans the surfaces of the circuit assembly in preparation for encapsulation. If the surfaces of the circuit assembly are not adequately cleaned prior to encapsulation, then friction with the surfaces of the circuit assembly may cause voids in the encapsulation material to form about the circuit assembly that can lead to failure of the encapsulated device. For example, a void may form in an area having high voltage circuitry on one side of the void and low voltage circuitry on another side of the void. The lack of isolation between the high and low voltage circuitry can reduce the lifetime of the packaged device. Thus, voids in the encapsulation material encasing an isolator should be prevented to reduce premature failures in the isolator.

While use of argon plasma presents no issues with gold bond wires, argon plasma causes palladium to sputter off of palladium coated copper bond wire. FIG. 1 shows a spectrum of a palladium coated copper bond wire prior to application of a plasma. The peak 102 represents copper signal intensity and the peak 104 represents palladium signal intensity. The peak 102 is lower than the peal 104 which indicates that the copper signal intensity is lower than the palladium signal intensity in the palladium coated copper bond wire prior to application of plasma.

Figure 2:
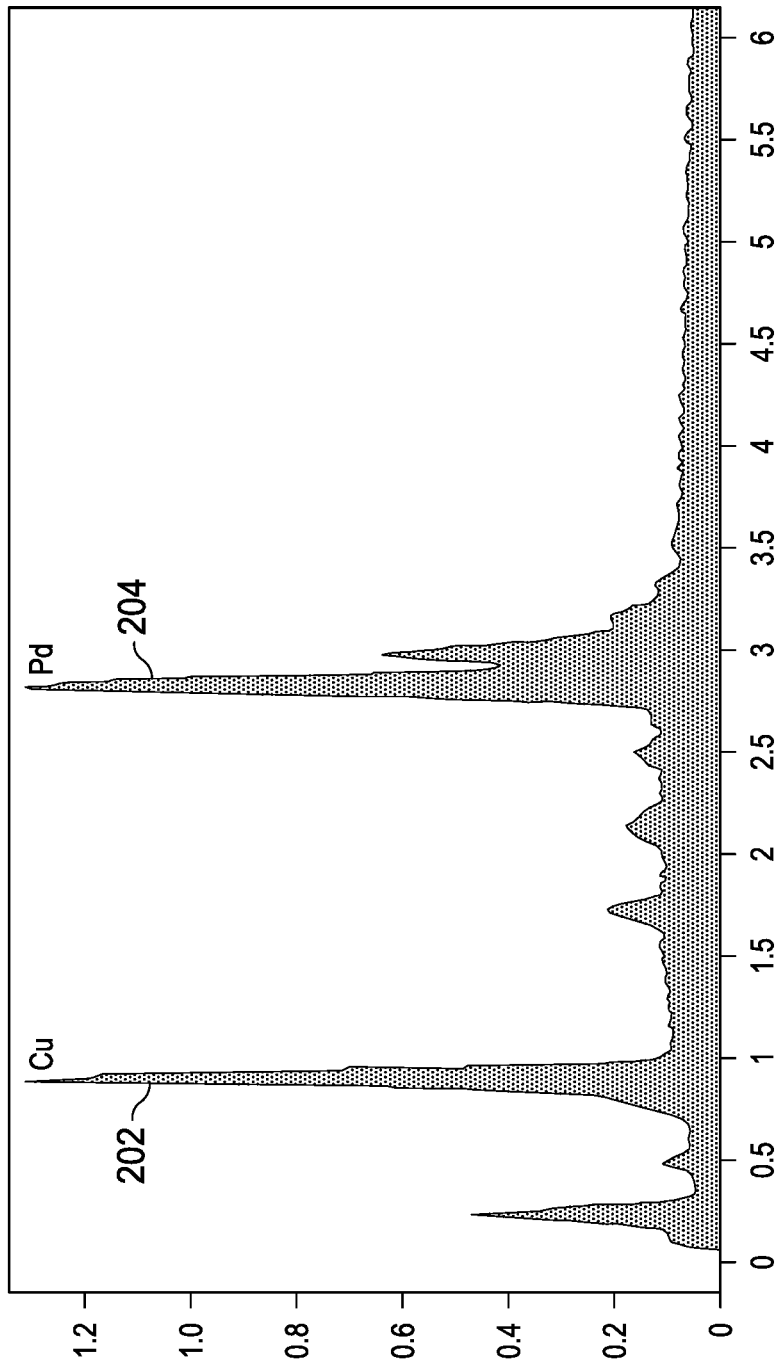
FIG. 2 shows a spectrum of a palladium coated copper bond wire after application of argon plasma in accordance with various examples.

FIG. 2 shows a spectrum of the palladium coated copper bond wire after application of argon plasma. The peak 202 represents copper signal intensity and the peak 204 represents palladium signal intensity. The spectrum indicates that relative amplitude of the copper and palladium signal peaks has changed (as compared to the peaks of FIG. 1). For example, the peak 202 may not be lower than the peak 204. The change in the relative amplitude of the copper and palladium signal peaks is caused by the sputtering of palladium from the palladium coated copper bond wire by the argon plasma.

Embodiments of the present disclosure avoid or reduce the loss of palladium from palladium coated copper bond wires without increasing the formation of voids in the encapsulation material. The packaging methods disclosed herein include a cleaning process that employs an oxygen plasma, rather than an argon plasma, to clean the circuit assembly after the palladium coated copper bond wires are attached. The oxygen plasma cleans the circuit assembly, and produces a low wetting angle on the surfaces of the circuit assembly in preparation for application of encapsulation material. Because of the low wetting angle produced by the oxygen plasma, voids are averted in the contact area of the circuit assembly and the encapsulation material, which in turn reduces the failure rate of the packaged device. Use of palladium coated copper, rather than gold, bond wires substantially reduces the cost of the packaged device.

Figure 3:
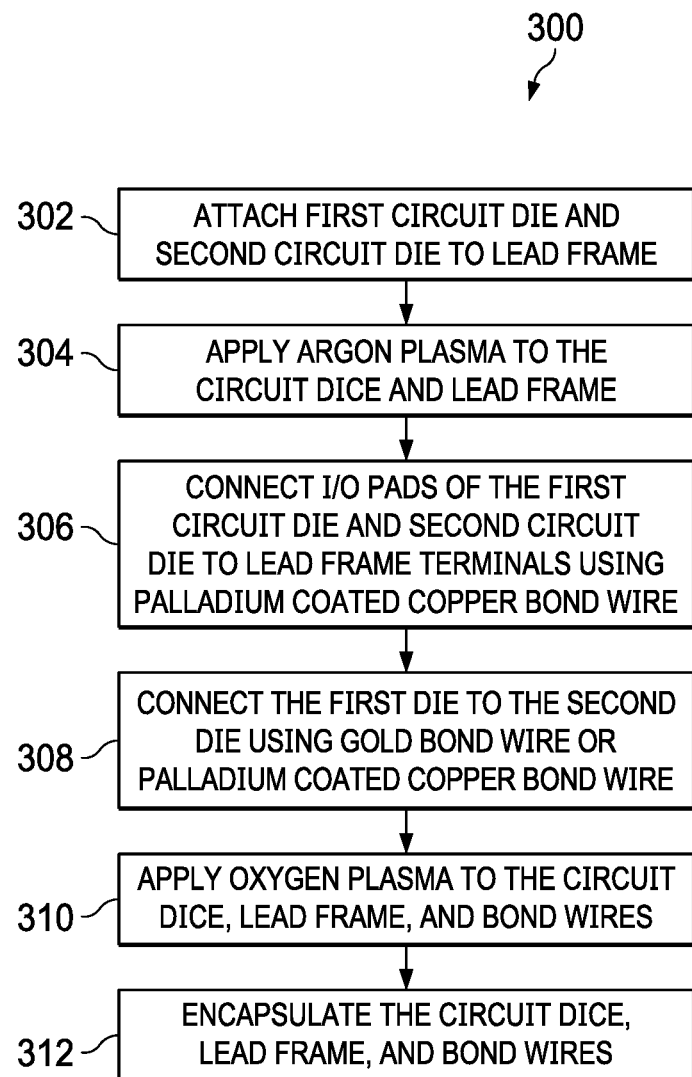
FIG. 3 shows a flow diagram for a method for packaging an integrated circuit in accordance with various examples.

FIG. 3 shows a flow diagram for a method 300 for packaging an integrated circuit in accordance with various examples. Though depicted sequentially as a matter of convenience, at least some of the actions shown can be performed in a different order and/or performed in parallel. Additionally, some embodiments may perform only some of the actions shown. In some embodiments, the integrated circuit packaged using the method 300 is an isolator.

Figure 5:
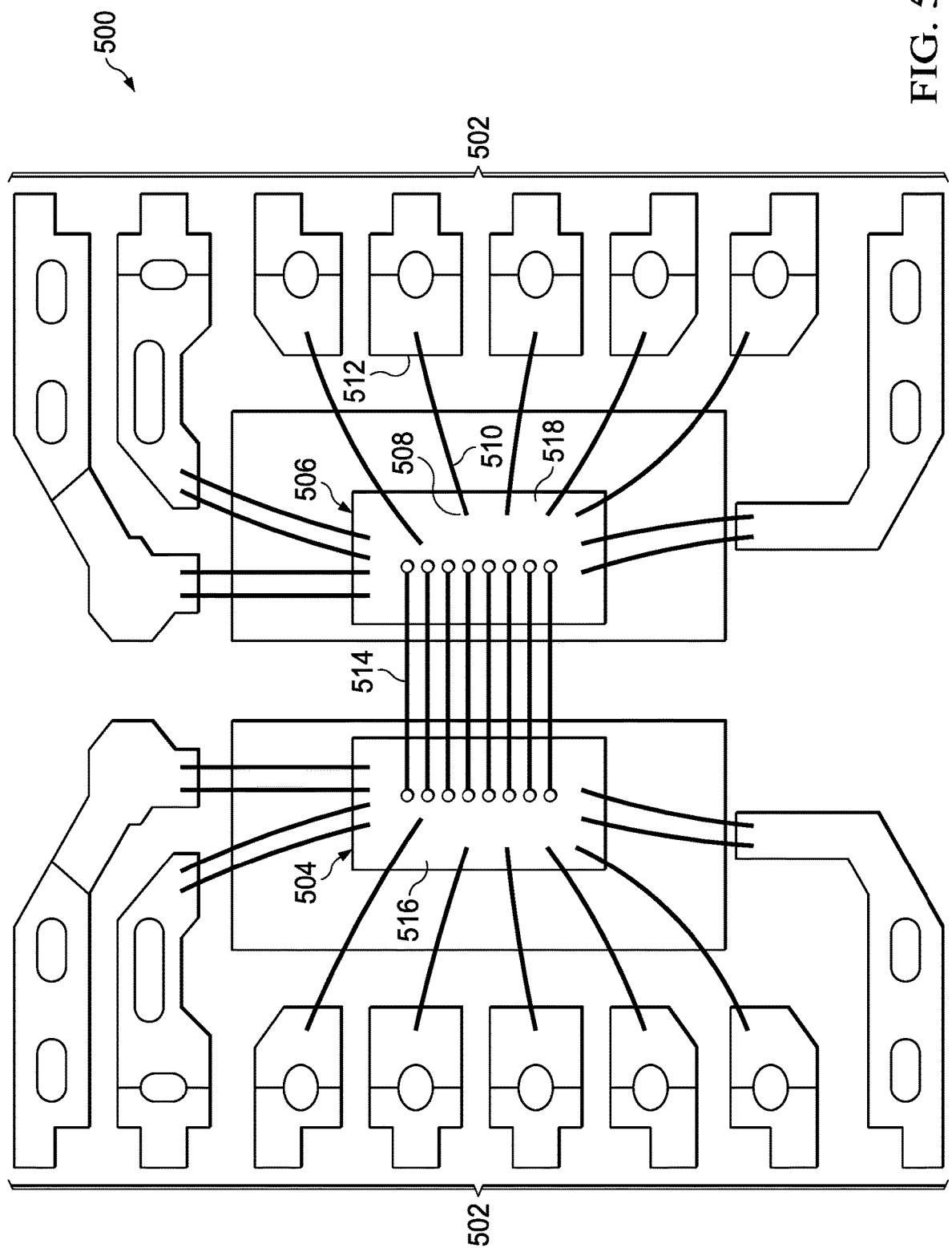
FIG. 5 shows a diagram of an isolator circuit assembly connected with palladium coated copper bond wires in accordance with various examples.

In block 302, a first circuit die is attached to a package lead frame, and a second circuit die is attached to a package lead frame. In some embodiments one or more circuit dice are attached to a package lead frame in block 302. The one or more circuit die may be attached to the lead frame with an adhesive, solder, or another bonding agent or attachment device. FIG. 5 shows a diagram of an isolator circuit assembly 500. In FIG. 5, a circuit die 504 is attached to a lead frame 502, and a circuit die 506 is attached to the lead frame 502.

In block 304, an argon plasma is generated and the argon plasma is applied to the circuit assembly produced in block 302. That is, the argon plasma is applied to the lead frame and the one or more dice affixed to the lead frame to clean the surfaces of the lead frame and the one or more circuit dice affixed to the lead frame in preparation for attachment of bond wires.

In block 308, the first circuit die 504 is conductively connected to the second circuit die 506. In some embodiments, gold bond wire is used to conductively connect the first circuit die 504 to the second circuit die 506. In some embodiments, palladium coated copper bond wire is used to conductively connect the first circuit die 504 to the second circuit die 506. FIG. 5 shows the circuit die 504 connected to the circuit die 506 using gold bond wires 514. Attachment of the bond wires connecting the first circuit die 504 to the second circuit die 506 may be by welding. In some embodiments (e.g., if the dice 504 and 506 form an isolator), a first end of the bond wire 514 is connected to a plate of a capacitor 516 formed on the first circuit die 504 and a second end of the bond wire 514 is connected to a plate of a capacitor 518 formed on the second circuit die 506. Communication between the first circuit die 504 and the second circuit die 506 via the capacitors 516, 518 connected by the bond wire 514 provides galvanic isolation between the first circuit die 504 and the second circuit die 506.

In block 308, the first circuit die 504 is conductively connected to the second circuit die 506. In some embodiments, gold bond wire is used to conductively connect the first circuit die 504 to the second circuit die 506. In some embodiments, palladium coated copper bond wire is used to conductively connect the first circuit die 504 to the second circuit die 506. FIG. 5 shows the circuit die 504 connected to the circuit die 506 using gold bond wires 514. Attachment of the bond wires connecting the first circuit die 504 to the second circuit die 506 may be by welding. In some embodiments (e.g., if the dice 504 and 506 form an isolator), a first end of the bond wire 514 is connected to a plate of a capacitor formed on the first circuit die 504 and a second end of the bond wire 514 is connected to a plate of a capacitor formed on the second circuit die 506. Communication between the first circuit die 504 and the second circuit die 506 via the capacitors connected by the bond wire 514 provides galvanic isolation between the first circuit die 504 and the second circuit die 506.

In block 310, an oxygen plasma is generated and the oxygen plasma is applied to the circuit assembly produced in block 308. That is, the oxygen plasma is applied to the lead frame, the one or more dice affixed to the lead frame, the palladium coated copper bond wires that connect the lead frame to the one or more dice, and the bond wires that connect the dice to one another. The oxygen plasma cleans the surfaces of the circuit assembly in preparation for encapsulation. Palladium is not sputtered from the palladium coated copper bond wires by the oxygen plasma. Wetting angles achieved on surfaces of the lead frame, the one or more dice affixed to the lead frame, the palladium coated copper bond wires that connect the lead frame to the one or more dice, and the bond wires that connect the dice to one another after application of the oxygen plasma are comparable to those obtained using argon plasma (e.g., less the 30°).

Figure 4:
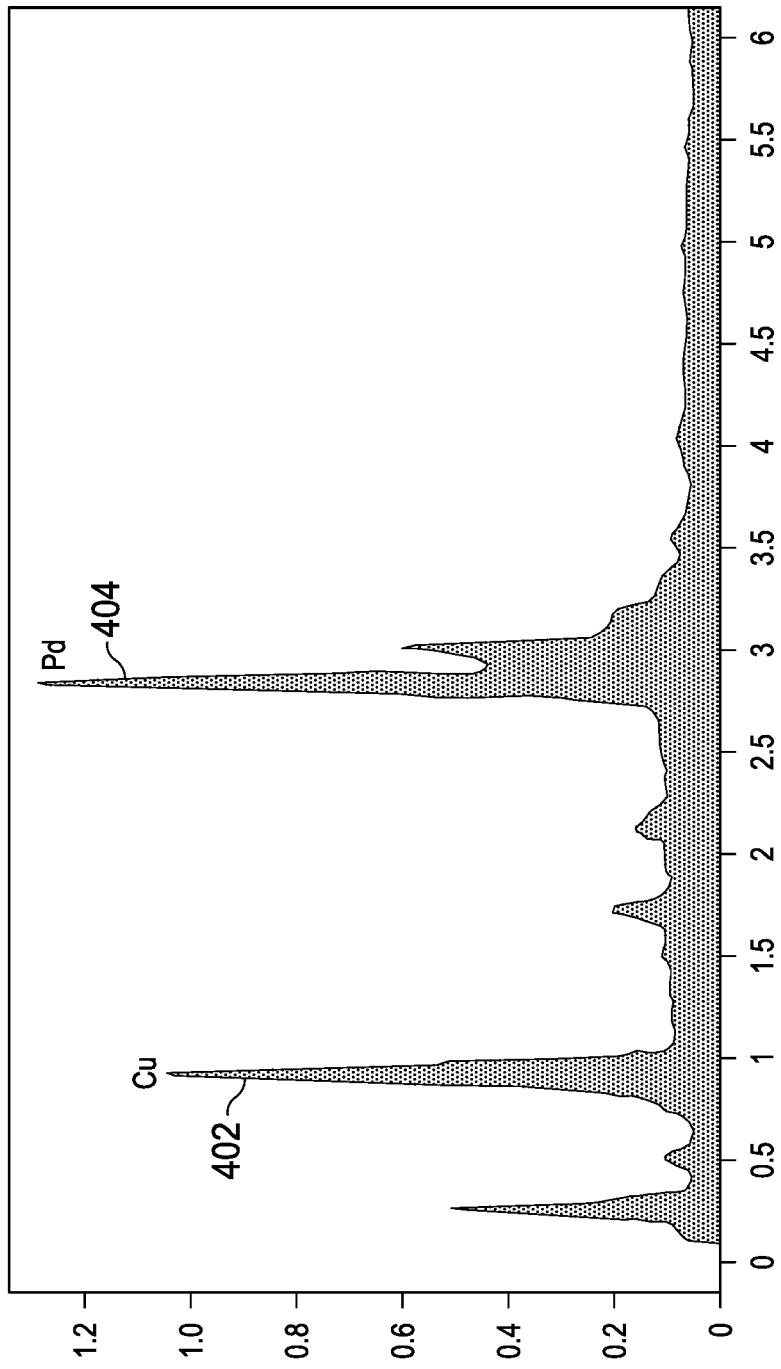
FIG. 4 shows a spectrum of a palladium coated copper bond wire after application of oxygen plasma in accordance with various examples.

FIG. 4 shows a spectrum of a palladium coated copper bond wire after application of oxygen plasma in accordance with various examples. The peak 402 represents copper signal intensity and the peak 404 represents palladium signal intensity. Like the spectrum for the pre-plasma palladium coated copper bond wire shown in FIG. 1, the peak 402 is lower than the peal 404 which indicates that the copper signal intensity is lower than the palladium signal intensity. Thus, application of the oxygen plasma does not sputter palladium from the palladium coated copper bond wire as does the argon plasma.

In block 312, an encapsulation material (e.g., an epoxy molding compound) is molded around the circuit assembly after application of the oxygen plasma. The encapsulation material encases the lead frame, dice, bonding wires, etc., while electrical contacts (e.g. pins) of the lead frame remain exposed for use in connecting the packaged integrated circuit to other systems. Because of the low wetting angles produced by the oxygen plasma, voids at the interface of the encapsulation material and the circuit assembly are reduced.

An example of the parameters applied to generate the argon plasma in block 304 and the oxygen plasma in block 310 is shown in Table 1 below.

TABLE 1

|  | Argon Plasma | Oxygen Plasma |
| --- | --- | --- |
| Power | 450 watts | 250 watts |
| Pressure | 740 mTor | 200 mTor |
| Time | 60 s | 60 s |
| Argon | 92 s.c.c.m. | 0 s.c.c.m. |
| Oxygen | 230 s.c.c.m. | 70 s.c.c.m. |

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit package comprising:
a first circuit die;
a second circuit die;
a portion of a lead frame;
palladium coated copper bond wires that conductively couple the first circuit die and the second circuit die to the lead frame;
gold bond wires that conductively couple the first circuit die to the second circuit die; and
encapsulation material covering the first circuit die, the second circuit die, the lead frame, the palladium coated copper bond wires, and the gold bond wires, wherein the first circuit die and the second circuit die are galvanically isolated.

2. The integrated circuit package of claim 1, wherein the first circuit die comprises a capacitor connected to one of the gold bond wires.

3. The integrated circuit package of claim 1, wherein the second circuit die comprises a capacitor connected to the one of the gold bond wires.

4. The integrated circuit package of claim 1, wherein an amount of palladium coating the palladium coated copper wires disposed within the encapsulation material is uniform over a surface of the palladium coated copper wires.

5. The integrated circuit package of claim 1, wherein an oxygen plasma is applied to the first integrated circuit die and the palladium coated copper wires.

6. The integrated circuit package of claim 1, wherein an argon plasma is applied to the first integrated circuit die.

7. An integrated circuit package comprising:
a first die attached to a first die attach pad;
a second die attached to a second die attach pad;
at least one gold wire connecting the first die and the second die; and
at least a first palladium coated copper wire connecting the first die to a first lead, and at least a second palladium coated copper wire connecting the second die to a second lead.

8. The integrated circuit package of claim 7 further comprising a first capacitor of the first die coupled to the at least one gold wire.

9. The integrated circuit package of claim 7 further comprising a second capacitor of the second die coupled to the at least one gold wire.

10. The integrated circuit package of claim 7, wherein the first die and the second die are galvanically isolated.

11. The integrated circuit package of claim 7, wherein the integrated circuit package is an isolation device.

12. The integrated circuit package of claim 7, wherein an amount of palladium coating the first palladium coated copper wires and the second palladium coated copper wires are uniform over a surface of the wires.

13. The integrated circuit package of claim 7 further comprising encapsulation material covering the first circuit die, the second circuit die, the first palladium coated copper wire, the second palladium coated copper wire, and the at least one gold wire.

* * * * *